United States Patent
Caulfield et al.

[11] Patent Number: 6,040,568
[45] Date of Patent: Mar. 21, 2000

[54] MULTIPURPOSE READOUT INTEGRATED CIRCUIT WITH IN CELL ADAPTIVE NON-UNIFORMITY CORRECTION AND ENHANCED DYNAMIC RANGE

[75] Inventors: John T. Caulfield, Santa Barbara; Richard H. Wyles, Carpinteria; John D. Schlesselmann; Kevin L. Pettijohn, both of Goleta, all of Calif.

[73] Assignee: Raytheon Company, Lexington, Mass.

[21] Appl. No.: 09/073,408

[22] Filed: May 6, 1998

[51] Int. Cl.[7] ........................................... H01L 25/00
[52] U.S. Cl. .................... 250/208.1; 250/332; 348/311
[58] Field of Search ............................. 250/208.1, 216, 250/332, 338.1, 338.4, 339.02, 349, 370.08; 348/164, 166, 301, 294, 311

[56] References Cited

U.S. PATENT DOCUMENTS

| | | | |
|---|---|---|---|
| 4,779,004 | 10/1988 | Tew et al. | 250/578 |
| 4,975,864 | 12/1990 | Sendall et al. | 364/571.01 |
| 5,323,334 | 6/1994 | Meyers et al. | 364/571.05 |
| 5,471,240 | 11/1995 | Prager et al. | 250/332 |
| 5,563,405 | 10/1996 | Woolaway, II et al. | 250/208.1 |
| 5,721,427 | 2/1998 | White et al. | 250/332 |
| 5,811,808 | 9/1998 | Cannata et al. | 250/370.08 |
| 5,925,883 | 7/1999 | Woolaway, II | 348/311 |

Primary Examiner—Stephone Allen
Attorney, Agent, or Firm—William C. Schubert; Glenn H. Lenzen, Jr.

[57] ABSTRACT

An IR-FPA (10) having a plurality of radiation detectors (2a) and a multipurpose ROIC (2) is disclosed. The radiation detectors (2a) are organized as a two dimensional array. The multipurpose ROIC (2) includes a plurality of readout circuit unit cells, individual ones of which are coupled to individual radiation detectors (2a) for receiving electrical signals therefrom. Each of the readout circuit unit cells operates in one of a first mode to provide a corrected m frame averaged output signal ($Vout_{THPF}$) or, a second mode to provide a subframed averaged output signal ($Vout_2$). In the first operating mode, a high pass filtering circuit subtracts a low frequency charge pedestal from the electrical signal to form the corrected m frame averaged output ($Vout_{THPF}$). Also disclosed is a method for operating an array of radiation detectors (2a) which includes the steps of: within a sampling period that defines a frame comprised of subframe periods, generating an electrical signal in individual ones of the radiation detectors, the electrical signals being generated in response to incident radiation; in a first operating mode, forming a high pass filtered output signal ($Vout_{THPF}$) from electrical signals generated during at least one frame period; in a second operating mode, forming a subframe averaged output signal ($Vout_2$) from electrical signals generated during a frame period; and reading out, in the first operating mode, the high pass filtered output signal ($Vout_{THPF}$) or, in the second operating mode, the subframe averaged output signal ($Vout_2$).

20 Claims, 11 Drawing Sheets

MULTIPURPOSE READOUT INTEGRATED CIRCUIT WITH IN CELL ADAPTIVE NON-UNIFORMITY CORRECTION AND ENHANCED DYNAMIC RANGE

FIELD OF THE INVENTION

This invention relates generally to sensors for electromagnetic radiation and, in particular, relates to focal plane arrays (FPAs) comprised of detectors responsive to infrared (IR) radiation.

BACKGROUND OF THE INVENTION

An IR-FPA includes an array of radiation detectors that views a scene of interest, detects thermal radiation arriving from the scene, and provides an image of the scene. A given radiation detector may be referred to as a unit cell or pixel. Incident radiation arriving from the scene of interest is converted by the radiation detectors to electric charge and integrated within each unit cell. The integrated charge within each unit cell of the IR-FPA is readout to form an analog output signal of the IR-FPA. A system analog-to-digital converter (ADC) converts the analog output signal of the IR-FPA into a digital signal. The digital signal is processed to provide the image of the scene of interest.

Figure 1:
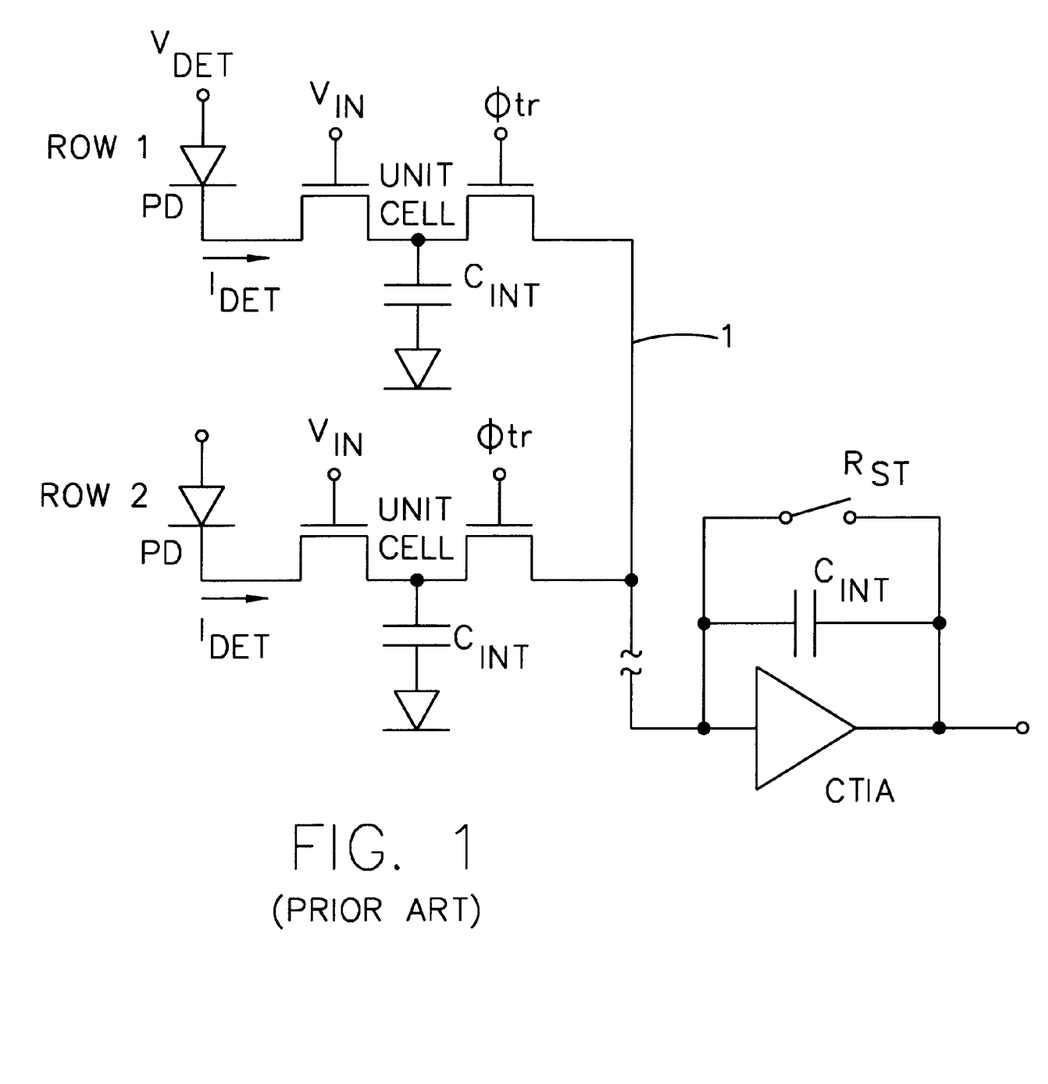
FIG. 1 is a schematic diagram of a conventional IR-FPA.

Referring to FIG. 1, a typical embodiment of an N row by M column IR-FPA is shown. In FIG. 1, each column of unit cells is provided with a column amplifier, such as a capacitive transimpedance amplifier or CTIA. A first set of transistors (connected to a potential ($V_{IN}$)) are controlled to properly bias a unit cell photodetector (PD), while a second set of transistors which function as switches (connected to timing signals transfer-phase or $\Phi$tr) are used to sequentially and individually connect N unit cells along a given column to a column sense or readout line 1 that is connected to the column's column amplifier (the CTIA). Each of the M column CTIAs may readout all the unit cells in parallel across a given one of the N rows, and then output a signal having a magnitude that is indicative of the radiation that was detected by the unit cells. This process continues until all N rows have been readout, thus forming an image frame. During an integration period, before readout, the detected current ($I_{DET}$) is integrated on a unit cell capacitance ($C_{INT}$). For a CTIA embodiment the column amplifier includes an integration capacitance and a solid state switch for periodically resetting the integration capacitance.

In an ideal case, each of the detector elements of the IR-FPA would operate in an identical manner so that each detector element would produce the same output signal in response to a particular input from the scene of interest. Realistically, uniformity in all detector elements is difficult to achieve, particularly when the N×M array is a large array. In view of this, techniques have been developed to suppress FPA non-uniformities. For example, commonly assigned U.S. Pat. No. 4,975,864, issued Dec. 4, 1990, entitled "Scene Based Nonuniformity Compensation for Staring Focal Plane Arrays", by Sendall et al., discloses scene-based nonuniformity compensation that serves to reduce stationary, as contrasted to moving, nonuniformities in the FPA's output signal. Similarly, commonly assigned U.S. Pat. No. 5,323,334, issued Jun. 21, 1994, entitled "Sensor System Having Nonuniformity Suppression with Image Preservation", by Meyers et al., discloses suppression of detector-based nonuniformities, without the loss of stationary features of the viewed image, by providing a physically moveable sensor which progressively corrects pixel intensities for detector element non-uniformity. The disclosure of these U.S. Patents are incorporated by reference herein in their entirety.

Currently available so-called second-generation IR-FPAs are capable of providing high dynamic range levels. High dynamic range levels have a potential for improving the image quality of the scene of interest. However, because the system ADC is generally limited in resolution and in conversion speed by power and space constraints, the system ADC may be unable to capture the full instantaneous dynamic range of the IR-FPA. Thus, image quality may be degraded. Additionally, non-uniformities in the IR-FPA output signal degrades image quality. The non-uniformities limit the system ADC's ability to capture the full instantaneous dynamic range of the IR-FPA. In view of this, techniques have been developed to adaptively control dynamic range and thus reduce the resolution required for the system ADC. For example, commonly assigned U.S. Pat. No. 5,563,405, issued Oct. 8, 1996, entitled "Staring IR-FPA With Adaptive Dynamic Range Control Electronics", by Woolaway, II et al., discloses a circuit architecture which provides an adaptive feedback to enable charge pedestal suppression on a per-pixel basis and thus achieve a higher dynamic range. The disclosure of this U.S. Patent is incorporated by reference herein in its entirety.

In addition to the non-uniformities discussed above, non-uniformities in the IR-FPA output signal may be introduced by such factors as system drift and 1/f noise resulting in spatial fixed pattern noise. In the prior art, IR-FPAs have employed readout integrated circuits (ROICs) having subframe averaging circuits to improve signal-to-noise ratios. For example, U.S. Pat. No. 4,779,004, issued Oct. 18, 1988, entitled "Infrared Imager", by Tew et al., discloses an IR-FPA employing a ROIC having an averaging circuit for recursive integration to enhance the signal-to-noise ratio of the IR-FPA. In particular, Tew et al. teaches an integration mode in which charge residing on an input capacitor is averaged X times per frame onto an averaging capacitor at each pixel of the array. In each frame, after the X times per frame, the charge residing on the averaging capacitors in each pixel is readout and the averaging capacitors are reset.

It can be appreciated that it would be desirable to enhance the non-uniformity correction or signal-to-noise ratio of the ROIC and thus, reduce the spatial or temporal noise of the ROIC, respectively. The prior art discussed above does not adequately address these needs.

OBJECTS AND ADVANTAGES OF THE INVENTION

It is a first object and advantage of this invention to provide a multipurpose ROIC that provides, in a unit cell, a temporal high pass filtered output that performs adaptive offset non-uniformity correction.

It is another object and advantage of this invention to provide a multipurpose ROIC that performs on focal plane processing in each pixel or unit cell.

It is another object and advantage of this invention to provide a multipurpose ROIC that provides superior performance in infrared sensing applications by removing substantially all types of fixed pattern noise generated in the FPA and also shading, vignetting and stray light originating in the optics and dewar system of the FPA.

It is another object and advantage of this invention to provide a multipurpose ROIC that adaptively subtracts a background low frequency charge pedestal from an input signal on a pixel by pixel basis.

It is another object and advantage of this invention to provide a multipurpose ROIC that provides an improved signal-to-noise ratio by lowering the noise floor.

Further objects and advantages of this invention will become more apparent from a consideration of the drawings and ensuing description.

SUMMARY OF THE INVENTION

The foregoing and other problems are overcome and the objects of the invention are realized by methods and apparatus in accordance with embodiments of this invention, wherein a multipurpose ROIC of an IR-FPA operates in two modes to provide, in a first operating mode, a per-pixel high pass filtered output that performs adaptive offset non-uniformity correction or, in a second operating mode, a subframed averaged output with improved sensitivity.

The present invention teaches a method for operating an array of radiation detectors of an IR-FPA. The method includes the steps of: during a sampling period that defines a frame comprised of subframe periods, generating an electrical signal in individual ones of the radiation detectors, the electrical signals being generated in response to incident radiation; in a first operating mode, forming a high pass filtered output signal from electrical signals generated during at least one frame period; in a second operating mode, forming a subframe averaged output signal from electrical signals generated during a frame period; and reading out, in the first operating mode, the high pass filtered output signal or, in the second operating mode, the subframe averaged output signal.

In one embodiment of the present invention, in the first operating mode, the method includes steps of: during one of m frame periods, averaging the generated electrical signal with a charge sharing circuit; during a predetermined series of frame periods, averaging the integrated electrical signals to form an averaged charge signal; and subtracting the averaged charge signal from a most recently generated electrical signal to form the high pass filtered output signal. In the present invention, and as noted above, the predetermined frame period in which the integrated electrical signals are averaged occurs once every m frame periods. Preferably, the mth frame period occurs within a range of about 1–8 frame periods.

The present invention also discloses, in the second operating mode, the method including the steps of: in the frame period, integrating the generated electrical signal with a subframe averaging circuit during a plurality of subframe periods; and at the conclusion of the plurality of subframe periods, reading out the integrated electrical signal to form the subframe averaged output signal. Preferably, the frame period is about 16.67 msec and typically there are up to about 64 subframe periods within each of the frame periods.

The present invention also discloses an IR-FPA having a plurality of radiation detectors each of which outputs an electrical signal having a magnitude that is a function of an amount of radiation that is detected by the radiation detector. The plurality of radiation detectors are organized as a two dimensional array having rows and columns. The IR-FPA further has a multipurpose ROIC which includes a plurality of readout circuit unit cells, individual ones of which are coupled to an individual one of the radiation detectors. Each of the individual readout circuit unit cells receives an electrical signal from a radiation detector, and in response provides, in a first operating mode, a high pass filtered output or, in a second operating mode, a subframe averaged output of the electrical signal.

BRIEF DESCRIPTION OF THE DRAWINGS

The above set forth and other features of the invention are made more apparent in the ensuing Detailed Description of the Invention when read in conjunction with the attached Drawings, wherein.

Identically labelled elements appearing in different ones of the above described figures refer to the same elements but may not be referenced in the description for all figures.

DETAILED DESCRIPTION OF THE INVENTION

Figure 2:
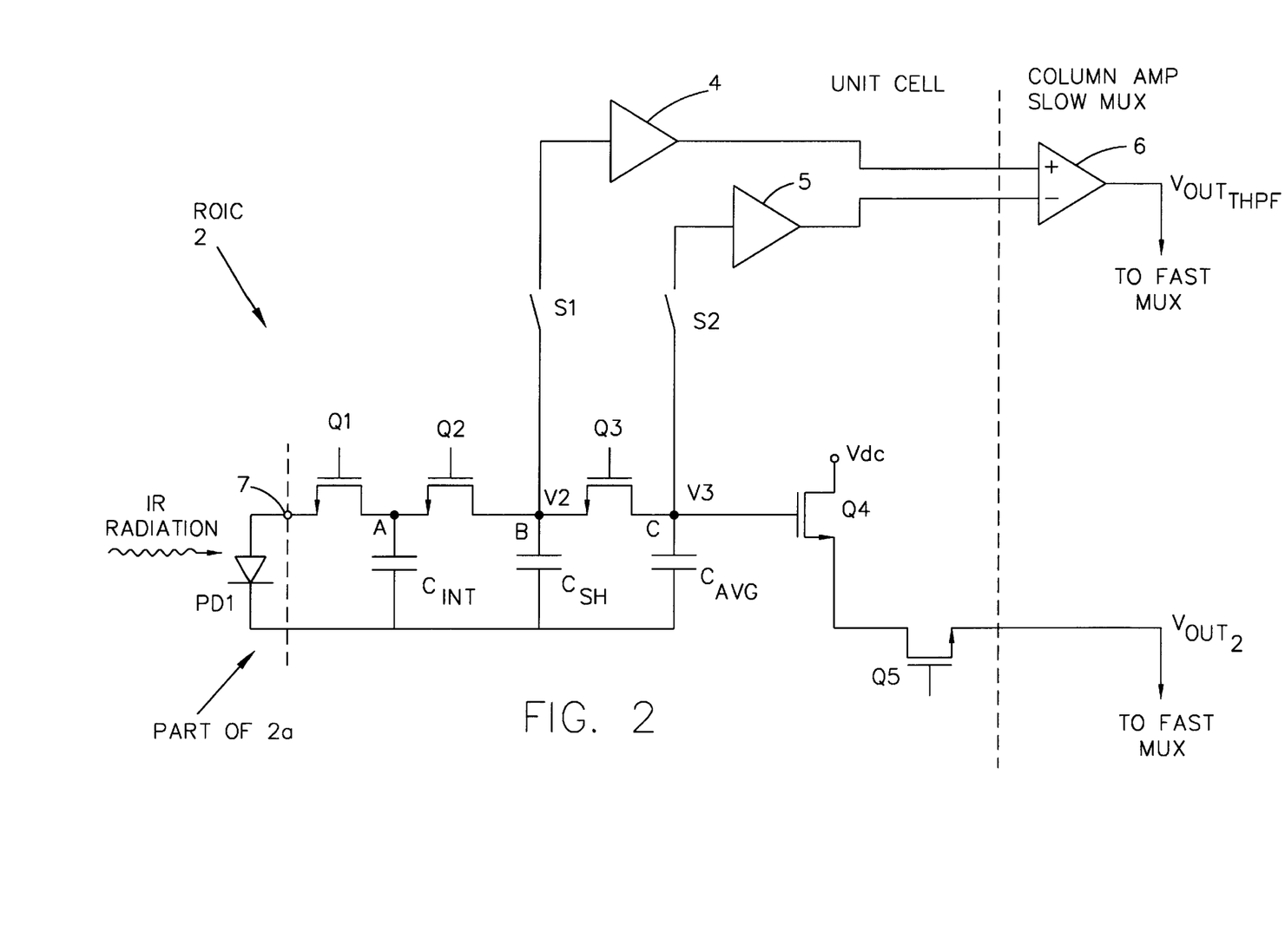
FIG. 2 is a schematic diagram of a multipurpose ROIC constructed in accordance with a first embodiment of the invention.

FIG. 2 illustrates a photodetector (PD1) from one row and one column of an IR radiation detector integrated circuit 2a that forms part of an IR-FPA 10 that is constructed in accordance with a first embodiment of the invention. It should be realized that there may be an arbitrary number of rows (e.g., 128), and an arbitrary number of columns (e.g., 256) within the IR radiation detector integrated circuit 2a. Each photodetector of a column is coupled via interconnects 7, such as indium bumps, to a multipurpose readout integrated circuit (ROIC) 2. The unit cells of the multipurpose ROIC 2 are connected to an associated column amplifier, preferably a CTIA (as described previously) or source follower.

Each unit cell of the multipurpose ROIC 2 includes an input for receiving a charge signal converted in a photodetector and includes a first transistor Q1, a second transistor Q2, a third transistor Q3, a fourth transistor Q4, an output transistor Q5, an integration capacitor $C_{INT}$, a sample and hold capacitor $C_{SH}$, a charge averaging capacitor $C_{AVG}$, a first buffer amplifier 4, a second buffer amplifier 5, and a differencing operational amplifier 6. Preferably, each of the transistors (Q1–Q5) is a MOSFET and the buffer amplifiers 4 and 5 are standard source follower FETs. A dc supply level is connected to a drain of the fourth transistor Q4. Also, one end of each of the integration capacitor $C_{INT}$, the sample and hold capacitor $C_{SH}$ and the charge averaging capacitor $C_{AVG}$ are connected to a common potential. FIG. 2 also shows a first switch S1 coupling a node B and the first buffer amplifier 4, as well as a second switch S2 coupling a node C and the second buffer amplifier 5. Switches S1 and S2 minimize effects of parasitic capacitance on the lines feeding the first buffer amplifier 4 and the second buffer amplifier 5. Preferably, each of the capacitors shown in FIG. 2 has a reset switch (not shown) electrically connected in parallel to the capacitor.

The IR radiation detector 2a of the IR-FPA 10 may be constructed of a Group II–VI material, such as HgCdTe, and may be sensitive to IR radiation within one or more spectral bands of interest. As employed herein Short Wavelength Infrared (SWIR) radiation is considered to include a spectral region extending from approximately 1000 nm to approximately 3000 nm. Medium Wavelength Infrared (MWIR) radiation is considered to include a spectral region extending from approximately 3000 nm to approximately 8000 nm. Long Wavelength Infrared (LWIR) radiation is considered to include a spectral region extending from approximately 7000 nm to approximately 14000 nm. Very Long Wavelength Infrared (VLWIR) radiation is considered to include a spectral region extending from approximately 12000 nm to approximately 30000 nm. Although the bands overlap to some extent, for the purposes disclosed herein the overlap is not considered to be significant. The semiconductor material that comprises the IR-FPA 10 is considered to exhibit significant responsivity to a given spectral band if the semiconductor material exhibits a maximum or substantially maximum photosensitivity to wavelengths within the given spectral band.

Figure 9:
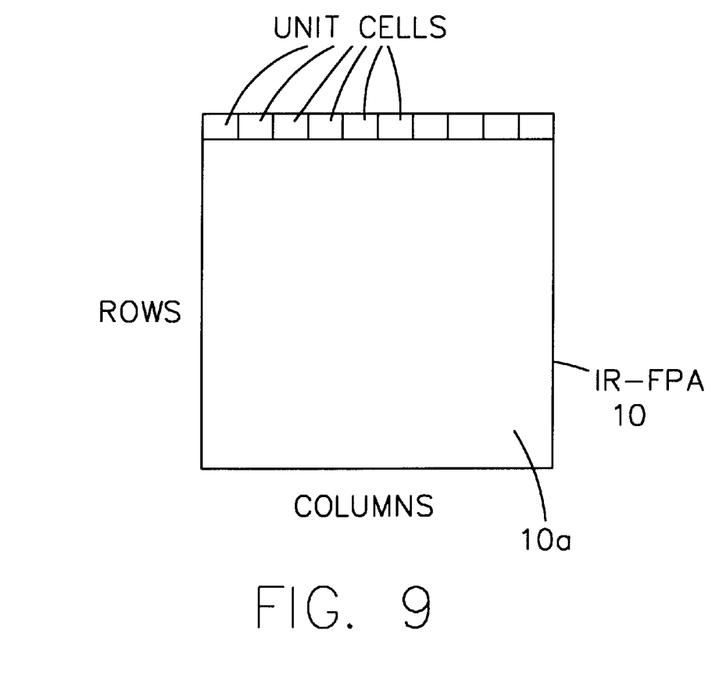
FIG. 9 is a front view of an IR-FPA and is useful in understanding the N×M matrix of the IR-FPA.
Figure 10:
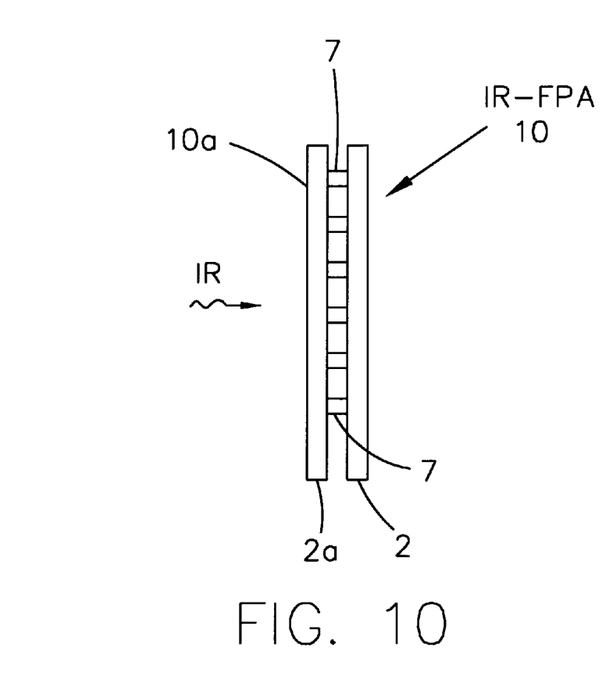
FIG. 10 is a side view of an IR-FPA that is hybridized with a multipurpose readout integrated circuit in accordance with an embodiment of the invention.

The multipurpose ROIC 2 is preferably constructed from silicon, and the CTIA and associated switches are fabricated in the silicon. Referring briefly to FIGS. 9 and 10, the two integrated circuits (i.e., IR radiation detector array 2a and multipurpose ROIC 2) are joined or hybridized together using, by example, the indium bumps 7, solder bumps, or any suitable electrically conductive coupling means, thus forming the IR-FPA 10. This enables each integrated circuit to be separately optimized for its intended function, and to then be electrically connected prior to operation. It is, however, within the scope of this invention to provide a monolithic embodiment, wherein some or all of the circuits of the multipurpose ROIC 2 are fabricated, for example, in the IR radiation detector 2a, or where IR radiation detecting material is epitaxially grown onto the silicon. Also shown in FIGS. 9 and 10 is a radiation receiving surface 10a which receives incident radiation arriving from a scene of interest.

Referring again to FIG. 2, the incident radiation arriving from the scene of interest is detected, or sampled, by the photodetector PD1 and converted to charge. The sampled charge is then integrated within each unit cell. In accordance with the present invention, the integration process within each unit cell is performed in two independent operating modes. In a first operating mode, a high pass filtered output, $Vout_{THPF}$, enables adaptive offset non-uniformity correction in the unit cells of all pixels. In a second operating mode, a subframe averaged output, $Vout_2$, enables enhanced dynamic range in the unit cells of all pixels. Referring briefly to the timing diagrams of FIGS. 4 and 6, it is apparent that the multipurpose ROIC 2 can be operating in either the first or the second operating modes.

Figure 3:
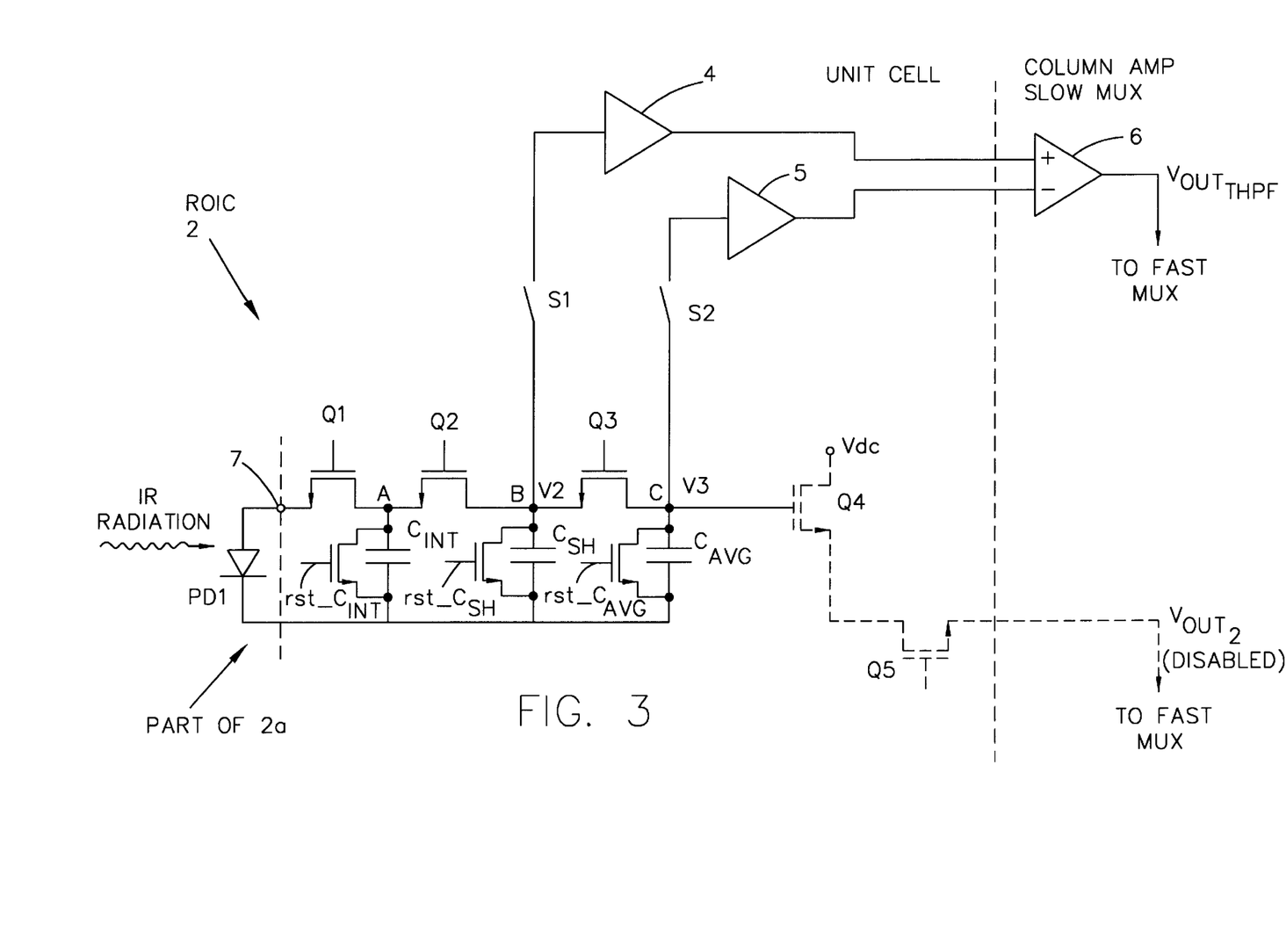
FIG. 3 is a schematic diagram of the multipurpose ROIC of FIG. 2 operating in a first mode to produce a high pass filtered output.
Figure 4:
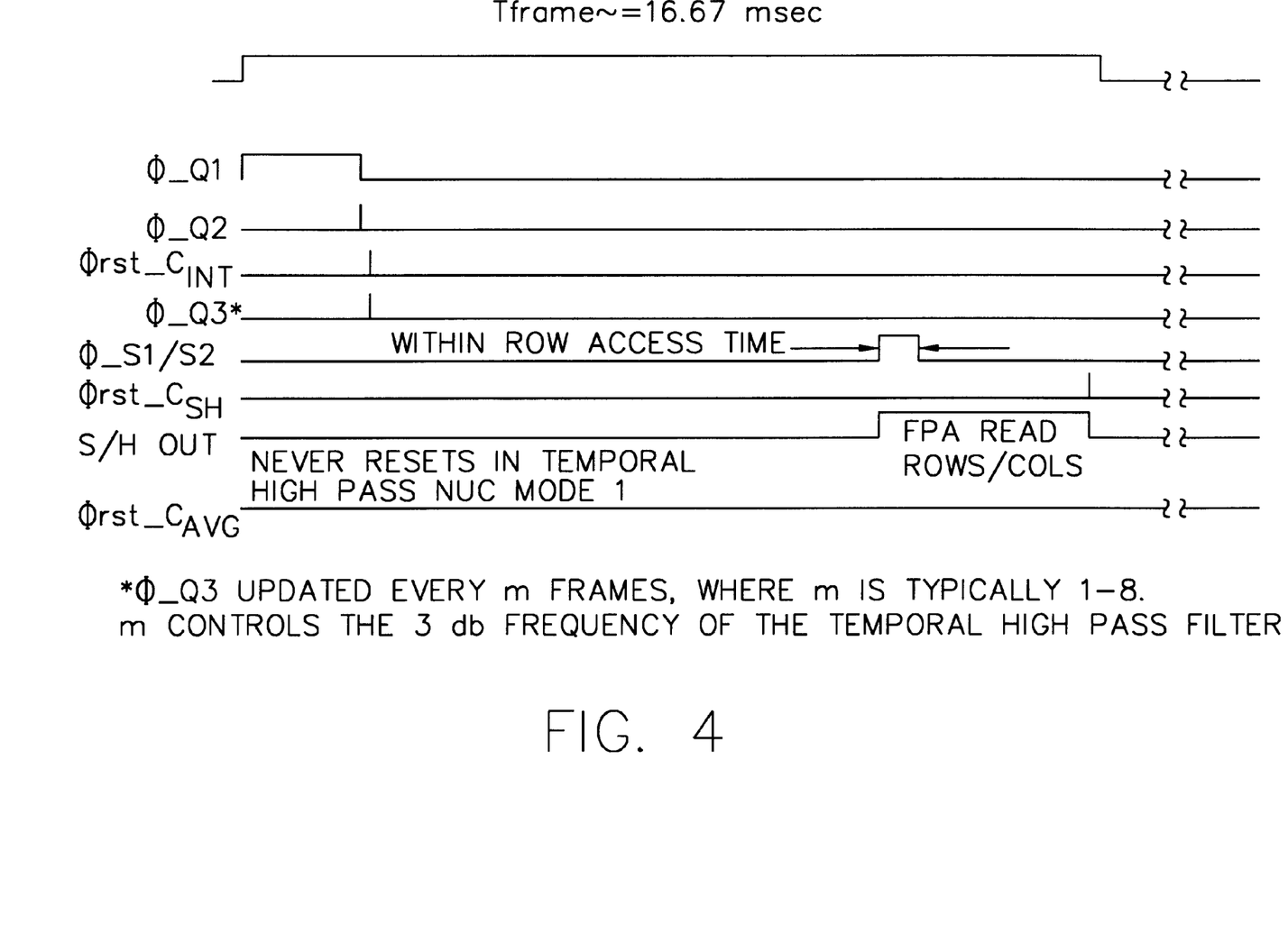
FIG. 4 is a timing diagram of an integration process of the first mode of the multipurpose ROIC operating in accordance with the present invention.

With reference to FIG. 3 and the timing diagram of FIG. 4, the first high pass filtered operating mode is described. It is first noted that within the timing diagram of FIG. 4, a high value indicates that the specified transistor, or switch, is on (closed).

As shown in FIG. 3, the output signal of the first operating mode, $Vout_{THPF}$, is provided at an output of the differencing operational amplifier 6, while the $Vout_2$ signal is disabled (shown in FIG. 3 as dashed lines). The $Vout_{THPF}$, is provided by subtracting a low frequency charge pedestal stored on $C_{AVG}$ from the sampled, i.e. detected, radiation converted to an electrical signal by the photodetector PD1. The subtraction process is performed by the differencing operational amplifier 6, which receives two input signals. The first input signal is received from the first buffer amplifier 4 which is electrically coupled to node B. The second input signal is received from the second buffer amplifier 5 which is electrically coupled to node C. During a readout process node B carries the most recent electrical signal converted by the photodetector PD1, while node C carries the averaged charge across the charge averaging capacitor $C_{AVG}$, i.e. the low frequency charge pedestal. Typical voltage magnitudes of the low frequency charge pedestal are designed to be in the range of between about −3.0 to +3.0 volts. Thus, the high pass filtered output $Vout_{THPF}$, enables adaptive offset non-uniformity correction in unit cells of all pixels.

During the use of the high pass filtered output $Vout_{THPF}$, the charge averaging capacitor $C_{AVG}$ is not reset. In fact, a reset switch $rst\_C_{AVG}$ for the charge averaging capacitor $C_{AVG}$ is disabled during the first operating mode (shown in FIG. 3 as dashed lines). Since the charge averaging capacitor $C_{AVG}$ is not reset, it acts as an adaptive offset for memorizing dark current variations arising from 1/f noise and system drift. Thus, the charge on the charge averaging capacitor $C_{AVG}$ automatically adapts to an average background level signal by repetitively averaging its signal with the charge on the sample and hold capacitor $C_{SH}$. Since the adapted charge is integrated from the sample and hold capacitor $C_{SH}$ onto the charge averaging capacitor $C_{AVG}$, as described above, the charge averaging capacitor $C_{AVG}$ slowly adapts to the background photocharge level.

It is noted that by adjusting a ratio of the charge averaging capacitor $C_{AVG}$ to the sample and hold capacitor $C_{SH}$ ($C_{AVG}/C_{SH}$), a range of frequency responses of the high pass filtered output $Vout_{THPF}$ can be set. Additionally, it is noted that the high pass filtered non-uniformity correction enables the IR-FPA 10 to be used without calibration sources, provided there is a minimum scene motion on the focal plane.

In the first high pass filtered operating mode, as shown in timing diagram of FIG. 4, the integration process begins on the rising edge of a frame signal (Tframe). The Tframe signal defines a predetermined time frame whose duration is, for example, 16.67 msec. On the rising edge of the Tframe signal, the first transistor Q1 is closed (signal $\Phi\_Q1$ high). When the first transistor Q1 is closed, the charge converted by the photodetector PD1 is integrated across the integration capacitor $C_{INT}$. On the falling edge of the $\Phi\_Q1$ signal, after a predetermined integration period, a series of transistor switches are closed and opened to effectuate the transfer of the charge converted by the photodetector PD1 from the integration capacitor $C_{INT}$ to the charge averaging capacitor $C_{AVG}$. However, as illustrated in FIG. 4, charge is integrated from the integration capacitor $C_{INT}$ to the sample and hold capacitor $C_{SH}$ only once during a Tframe period, and typically, every m Tframe periods. Because the sample and hold capacitor $C_{SH}$ is, by design, smaller than the integration capacitor $C_{INT}$, the voltage on the sample and hold capacitor $C_{SH}$ is nearly the same as on the integration capacitor $C_{INT}$ after the charge is integrated.

The transfer begins, on the falling edge of the Φ_Q1 signal, when the first transistor Q1 is opened and the second transistor Q2 is closed (signal Φ_Q2 high). In response to the opening of the first transistor Q1 and the closing of the second transistor Q2, the charge integrated across the integration capacitor $C_{INT}$ is passed onto the sample and hold capacitor $C_{SH}$. Once the charge is passed to the sample and hold capacitor $C_{SH}$, the second transistor Q2 is opened and a reset switch rst_$C_{INT}$ is closed (signal Φrst_$C_{INT}$ high) to reset the integration capacitor $C_{INT}$.

At a predetermined time, the third transistor Q3 is closed (signal Φ_Q3 high) to pass the charge across the sample and hold capacitor $C_{SH}$ onto the charge averaging capacitor $C_{AVG}$. Once the charge is passed to the charge averaging capacitor $C_{AVG}$, the third transistor Q3 is opened. As noted in the timing diagram of FIG. 4, the third transistor Q3 is closed (signal Φ_Q3 high) every m Tframe periods. In other words, the charge is passed from the sample and hold capacitor $C_{SH}$ onto the charge averaging capacitor $C_{AVG}$ once every m Tframes. As such, there is no interframe subframing.

It is noted that the variable m represents a predetermined number of Tframe periods, typically about 1–8 Tframe periods, and is varied to control the adaptation frequency of the high pass filtered output, $Vout_{THPF}$. The variable m is selected based upon the IR scene energy and motion, and also based upon the detector noise and leakage currents. The higher the value of the variable m, the slower the adaptive rate. Thus, the variable m is adaptable to the IR scene and the total amount of image nonuniformity.

Since the charge averaging capacitor $C_{AVG}$ is, by design, larger the sample and hold capacitor $C_{SH}$ it takes several Tframe periods to build up the signal on the charge averaging capacitor $C_{AVG}$. Thus, the charge on the charge averaging capacitor $C_{AVG}$ can be seen to represent a low pass filtered version of the input scene and noise wherein the slowly varying features are de-emphasized.

On the rising edge of a sample and hold output signal (S/H Out high), the $Vout_{THPF}$ output of each row and column of the multipurpose ROIC 2 of the IR-FPA 10 is readout. Also, on the rising edge of the S/H Out signal, the first switch S1 and the second switch S2 are closed (signal Φ_S1/S2 high). The switches S1 and S2 remain closed within a row access time of the readout of the multipurpose ROIC 2. Once each row and column is readout, and on the falling edge of the S/H Out signal, a reset switch rst_$C_{SH}$ is closed (signal Φrst_$C_{SH}$ high) to reset the sample and hold capacitor $C_{SH}$. The reset of the sample and hold capacitor $C_{SH}$ marks the end of the Tframe period.

As is noted above and on the timing diagram of FIG. 4, the reset switch rst_$C_{AVG}$ (signal Φrst_$C_{AVG}$) is not closed during the first high pass filtered operating mode. Thus, in the first high pass filtered operating mode, the charge averaging capacitor $C_{AVG}$ learns and remains adapting around the average background level. In particular, the charge on the charge averaging capacitor $C_{AVG}$ provides one input to the subtractor, embodied in the differencing operational amplifier 6, while the most recent charge signal on the sample and hold capacitor $C_{SH}$ forms the other input to the subtractor. Since, as noted above, the charge on the charge averaging capacitor $C_{AVG}$ represents the low pass filtered version of the input scene and noise, subtracting the charge on the charge averaging capacitor $C_{AVG}$ from the charge on the sample and hold capacitor $C_{SH}$ yields a high pass filtered output corrected for input scene and noise charge.

Thus, in operation, the high pass filter ac couples the converted electrical signal from the photodetector by subtracting a slowly varying pedestal in the image (V3) from more rapidly changing features within the scene (V2). The relevant transfer function is from V2 to $Vout_{THPF}$. At an nth sample, $Vout_{THPF}$ is determined in accordance with the following equation:

$$Vout_{THPF}[n] = V2[n] - \frac{C_{SH}V2[n-m] + C_{AVG}V3[n-m]}{C_{SH} + C_{AVG}} \qquad (1)$$

where: $C_{SH}$ is the capacitance of the sample and hold capacitor; $C_{AVG}$ is the capacitance of the charge averaging capacitor; and m is a number of delay periods after which the capacitance across the sample and hold capacitor, $C_{SH}$, is sampled onto the charge averaging capacitor, $C_{AVG}$.

Thus, the m delay periods are expressed as:

$$T_{CAVG} = m \, T_{CSH},$$

and $$T_{CSH} = \tfrac{1}{2} f_{CSH} \qquad (2)$$

where: $f_{CSH}$ is the frequency of the sample and hold capacitor.

The frequency response of the circuit is derived by substituting Equation (2) into Equation (1), and is expressed in accordance with the following equation:

$$H(f) = \frac{Vout_{THPF}(f)}{V2(f)} = \frac{2}{1+\alpha^2} \frac{1 - \cos(2\pi m f T2)}{1 - \frac{2\alpha}{1+\alpha^2}\cos(2\pi m f T2)} \qquad (3)$$

where:

$$\alpha = \frac{1}{\left(1 + \dfrac{C_{SH}}{C_{AVG}}\right)}$$

Figure 11:
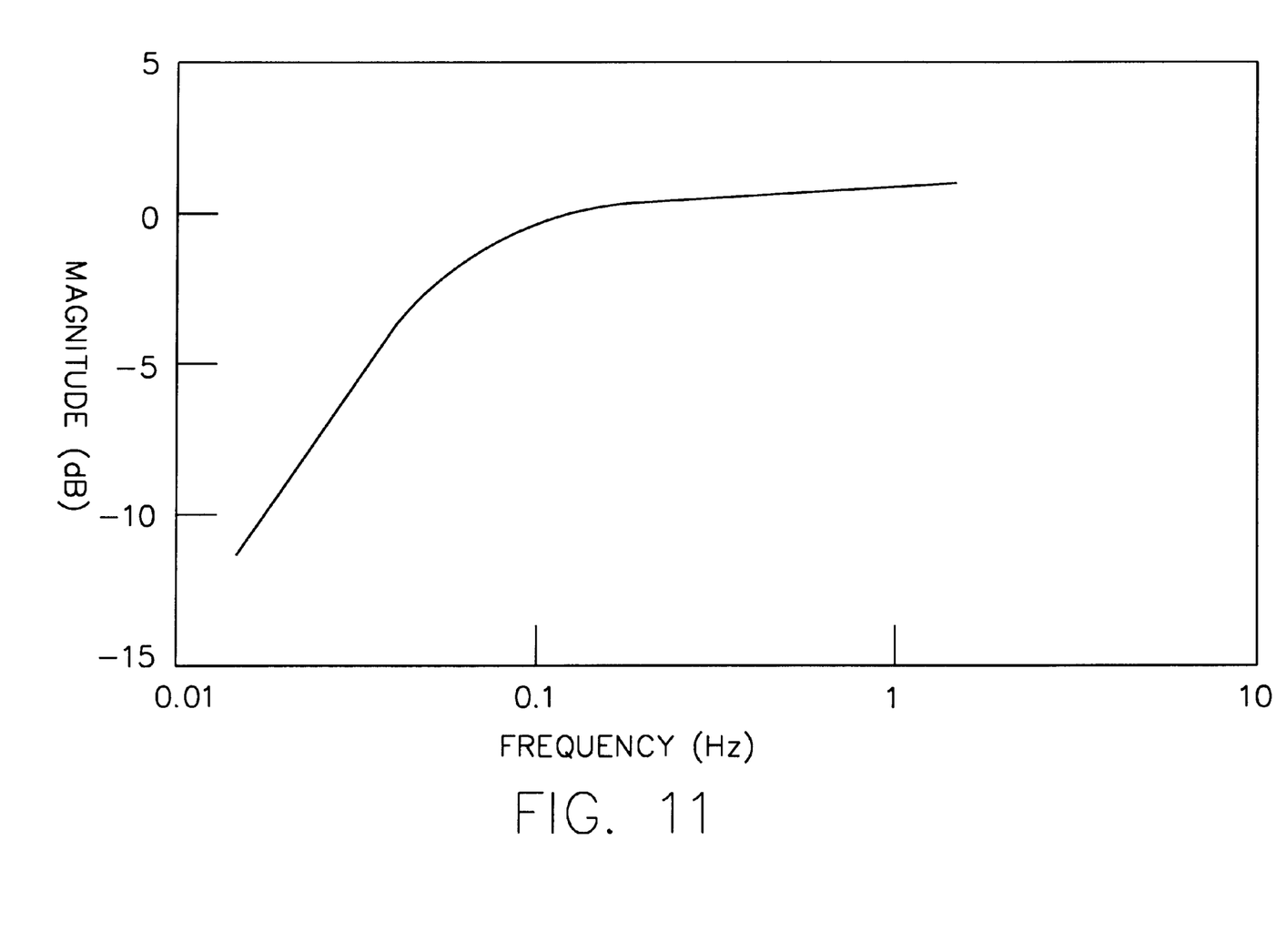
FIG. 11 is a graph of the magnitude of frequency response of a multipurpose ROIC in accordance with the present invention.

The magnitude of the response detailed in Equation (3) is plotted in FIG. 11 for the exemplary case of m=1 and $C_{SH}/C_{AVG}=0.25$.

The transfer function is a high pass filter with a −3 dB corner frequency in accordance with the following equation:

$$f_{-3dB} = \frac{1}{2\pi T2} \frac{1}{m} \cos^{-1}\left(\frac{1 + \dfrac{C_{SH}}{C_{AVG}}}{1 + \dfrac{C_{SH}}{C_{AVG}} + \dfrac{1}{2}\left(\dfrac{C_{SH}}{C_{AVG}}\right)^2}\right) \qquad (4)$$

Figure 12A:
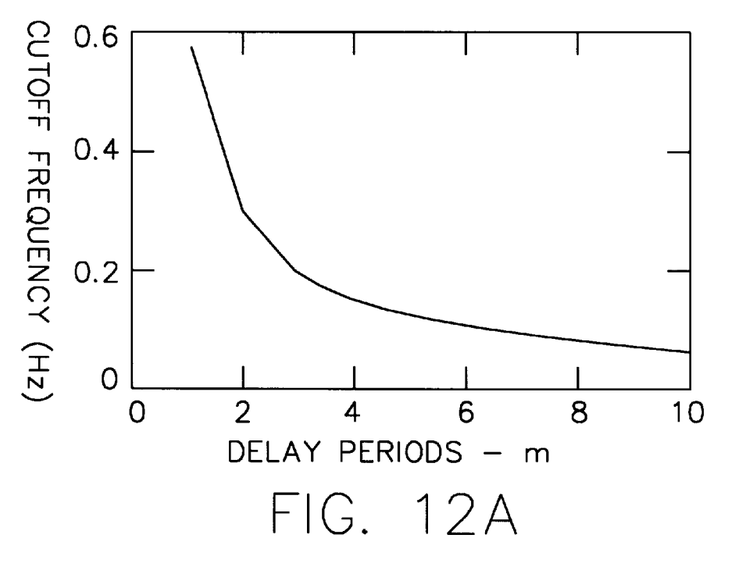
FIGS. 12a and 12b illustrate a −3 dB corner frequency as it varies as a function of m delay periods and a capacitance ratio.
Figure 12B:
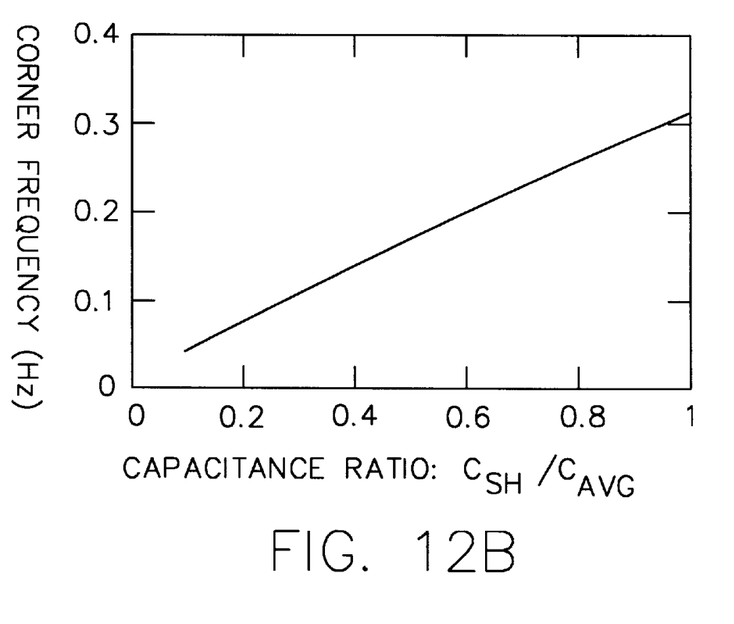

It is deduced from Equation (4) that the adaptive non-uniformity correction frequency response is set to reduce system drift and 1/f noise by the independent adjustment of two parameters, the number of delay periods m and the capacitance ratio $C_{SH}/C_{AVG}$. FIGS. 12a and 12b illustrate how the −3 dB corner frequency varies as a function m (FIG. 12a) and the capacitance ratio (FIG. 12b).

Figure 5:
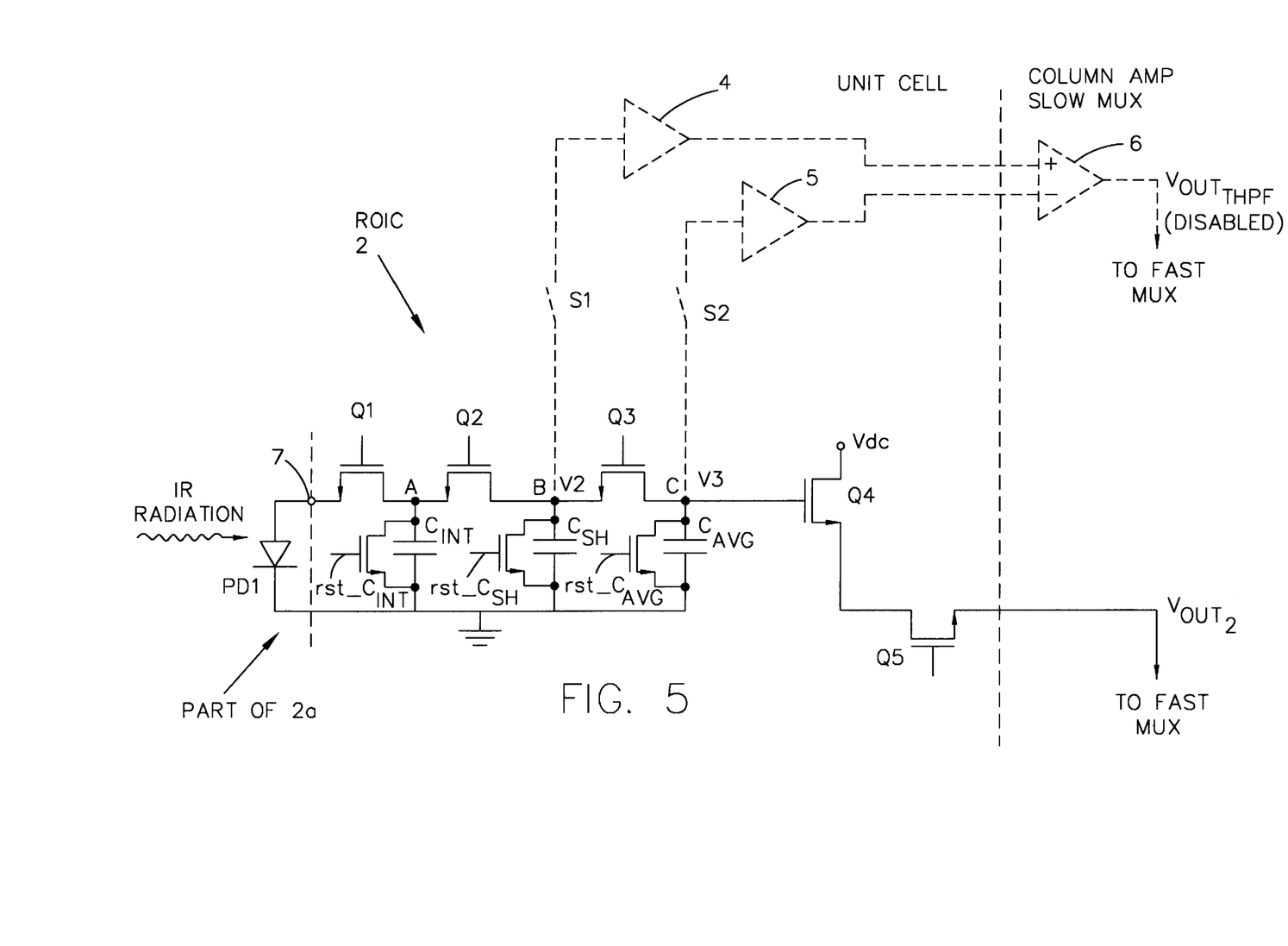
FIG. 5 is a schematic diagram of the multipurpose ROIC of FIG. 2 operating in a second mode to produce a subframed averaged output.

As noted above, in the second operating mode the subframe averaged output $Vout_2$ enables enhanced dynamic range in the unit cells of all pixels. With reference to FIG. 5 and the timing diagram of FIG. 6, the second subframed averaged operating mode is described. It is noted that, as in FIG. 4, within the timing diagram of FIG. 6, a high value indicates that the specified transistor, or switch, is on (closed).

As shown in FIG. 5, the output signal of the second operating mode, $Vout_2$, is provided at a source of the output transistor Q5, while the $Vout_{THPF}$ signal is disabled (shown in FIG. 5 as dashed lines). As noted above and in accordance with the present invention, the subframed averaged output $Vout_2$ enables enhanced dynamic range in unit cells of all pixels.

Figure 6:
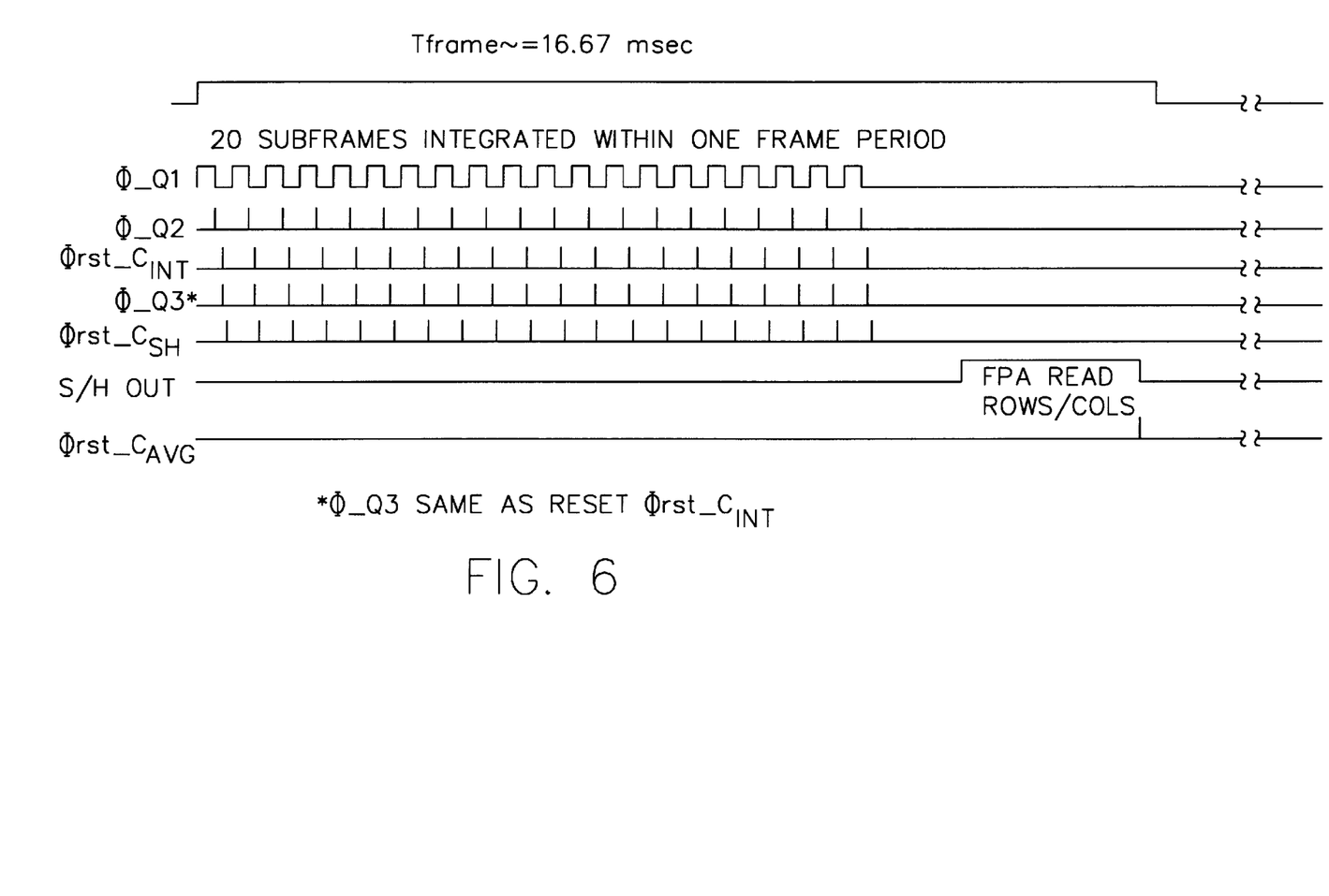
FIG. 6 is a timing diagram of an integration process of the second mode of the multipurpose ROIC operating in accordance with the present invention.

The integration process begins on the rising edge of a frame signal (Tframe). The Tframe signal defines a predetermined time frame whose duration is, for example, 16.67 msec. On the rising edge of the Tframe signal, the first transistor Q1 is closed (signal Φ_Q1 high). When the first transistor Q1 is closed, the charge converted by the photodetector PD1 is integrated across the integration capacitor $C_{INT}$. The first transistor Q1 remains closed for a second, shorter predetermined frame period referred to as a subframe period. There are n subframe periods within one Tframe period. In one embodiment of, for example the 16.67 msec Tframe period, there are up to 64 subframe periods within a Tframe period. The number of subframe periods within one Tframe period, i.e. the value of n, is dependent upon the application, the background flux level, and the selection of capacitor sizes. In FIG. 6, for example, the value of n is equal to 20.

On the falling edge of each subframe period, a series of transistor switches are closed and opened to effectuate the transfer of the charge photogenerated in the photodetector PD1 from the integration capacitor $C_{INT}$ to the charge averaging capacitor $C_{AVG}$. The transfer begins, on the falling edge of each subframe period, when the first transistor Q1 is opened (signal Φ_Q1 low) and the second transistor Q2 is closed (signal Φ_Q2 high). In response to the opening of the first transistor Q1 and the closing of the second transistor Q2, the charge integrated across the integration capacitor $C_{INT}$ is passed across the sample and hold capacitor $C_{SH}$. Once the charge is passed to the sample and hold capacitor $C_{SH}$, the second transistor Q2 is opened (signal Φ_Q2 low) and a reset switch rst_$C_{INT}$ is closed (signal Φrst_$C_{INT}$ high) to reset the integration capacitor $C_{INT}$. As noted in the timing diagram of FIG. 6, the third transistor Q3 is closed at the same time the reset switch rst_$C_{INT}$ is closed (signals Φrst_$C_{INT}$ and Φ_Q3 high at the same time). When the third transistor Q3 is closed, the charge across the sample and hold capacitor $C_{SH}$ is passed to the charge averaging capacitor $C_{AVG}$. Once the charge is passed to the charge averaging capacitor $C_{AVG}$, the third transistor Q3 is opened (signal Φ_Q3 low) and a reset switch rst_$C_{SH}$ is closed (signal Φrst_$C_{SH}$ high) to reset the sample and hold capacitor $C_{SH}$.

On the rising edge of a next subframe signal (signal Φ_Q1 high), the first transistor Q1 is again closed. As above, a next charge photogenerated in the photodetector PD1 is integrated across the integration capacitor $C_{INT}$. On the falling edge of the next subframe period (signal Φ_Q1 low), the series of transistor switches are again closed and opened to effectuate the transfer of the next charge photogenerated in the photodetector PD1 from the integration capacitor $C_{INT}$ to the charge averaging capacitor $C_{AVG}$. This transfer process continues for each subframe period as incident radiation received by the photodetector is repetitively sampled. It is noted that during the subframe periods the charge across the charge averaging capacitor $C_{AVG}$ is not reset. As a result, an averaged charge is averaged and held on the charge averaging capacitor $C_{AVG}$.

Referring again to FIG. 6, at the conclusion of the n subframe periods and on the rising edge of a sample and hold output signal (S/H Out high), each row and column of the multipurpose ROIC 2 of the IR-FPA 10 is readout. Once each row and column is readout and on the falling edge of the S/H Out signal, a reset switch rst_$C_{AVG}$ is closed (signal Φrst_Q3 high) to reset the charge averaging capacitor $C_{AVG}$. The reset of the charge averaging capacitor $C_{AVG}$ marks the end of the Tframe period for the second operating mode.

In the second subframe averaging operating mode, charge from the integration capacitor $C_{INT}$ is integrated to the sample and hold capacitor $C_{SH}$, then to the charge averaging capacitor $C_{AVG}$, and then readout as output $Vout_2$. As a result of this subframe integrated process, a high stare efficiency, an increased effective charge integration capacity of, for example, greater than $10^9$ electrons, and improved sensitivity are realized. Additionally, the $Vout_2$ output functions as a standard direct injection output when appropriate ROIC timing changes are made.

Figure 7:
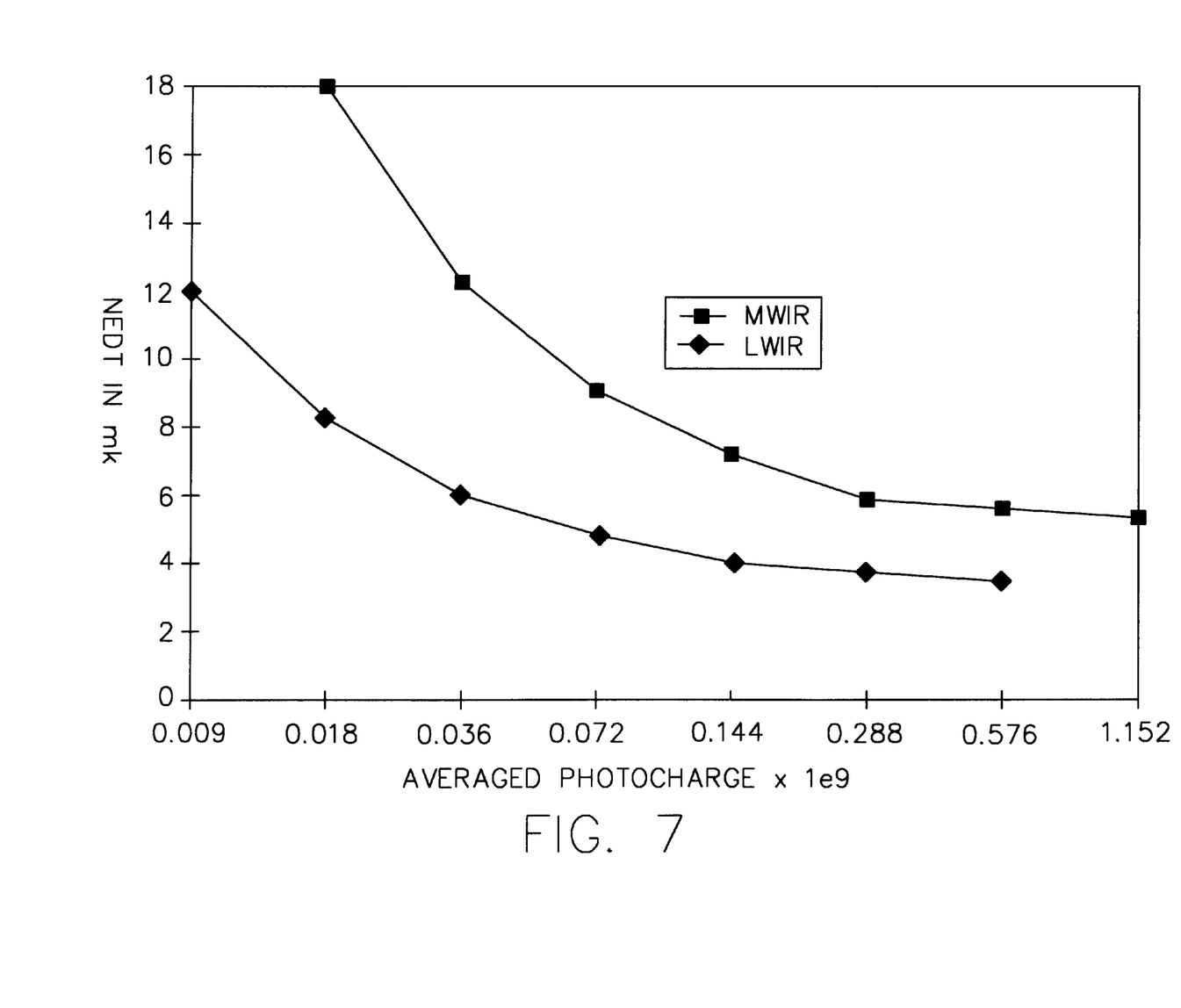
FIG. 7 is a graph of the NEDT versus averaged photocharge of a Medium Wavelength Infrared signal as compared to a Long Wavelength Infrared signal as produced by the second operating mode of the present invention.

A ROIC 2, which operates in accordance with the present invention, is seen to have realized improvements over conventional ROIC in areas which include, for example, wavelength response (e.g., about a 3 times improvement), background flux (e.g., about a 3.5 times improvement), charge handling (e.g., about a 64 times improvement), duty factor (e.g., about a 18 times improvement) and noise equivalent differential temperature (NEDT) (e.g., about a 7.5 times improvement). For example, the about 7.5 times improvement in NEDT is graphically illustrated in FIG. 7. FIG. 7 is a plot of NEDT in mK versus an averaged photocharge shown on a $1\times10^9$ electron scale for two signals, a Medium Wavelength Infrared signal (MWIR) and a Long Wavelength Infrared signal (LWIR).

In accordance with the present invention and as described above, the readout of each row and column of the multipurpose ROIC 2 of the IR-FPA 10 is accomplished in two independent operating modes. In the first high pass filtered operating mode, the $Vout_{THPF}$ signal is connected to an associated column amplifier (the CTIA or source follower) as discussed above. In the second subframe averaging operating mode, the $Vout_2$ signal is connected to the associated column amplifier. In the present invention, only one of the two output signals is readout at any given time during the operation of the IR-FPA 10.

Figure 8:
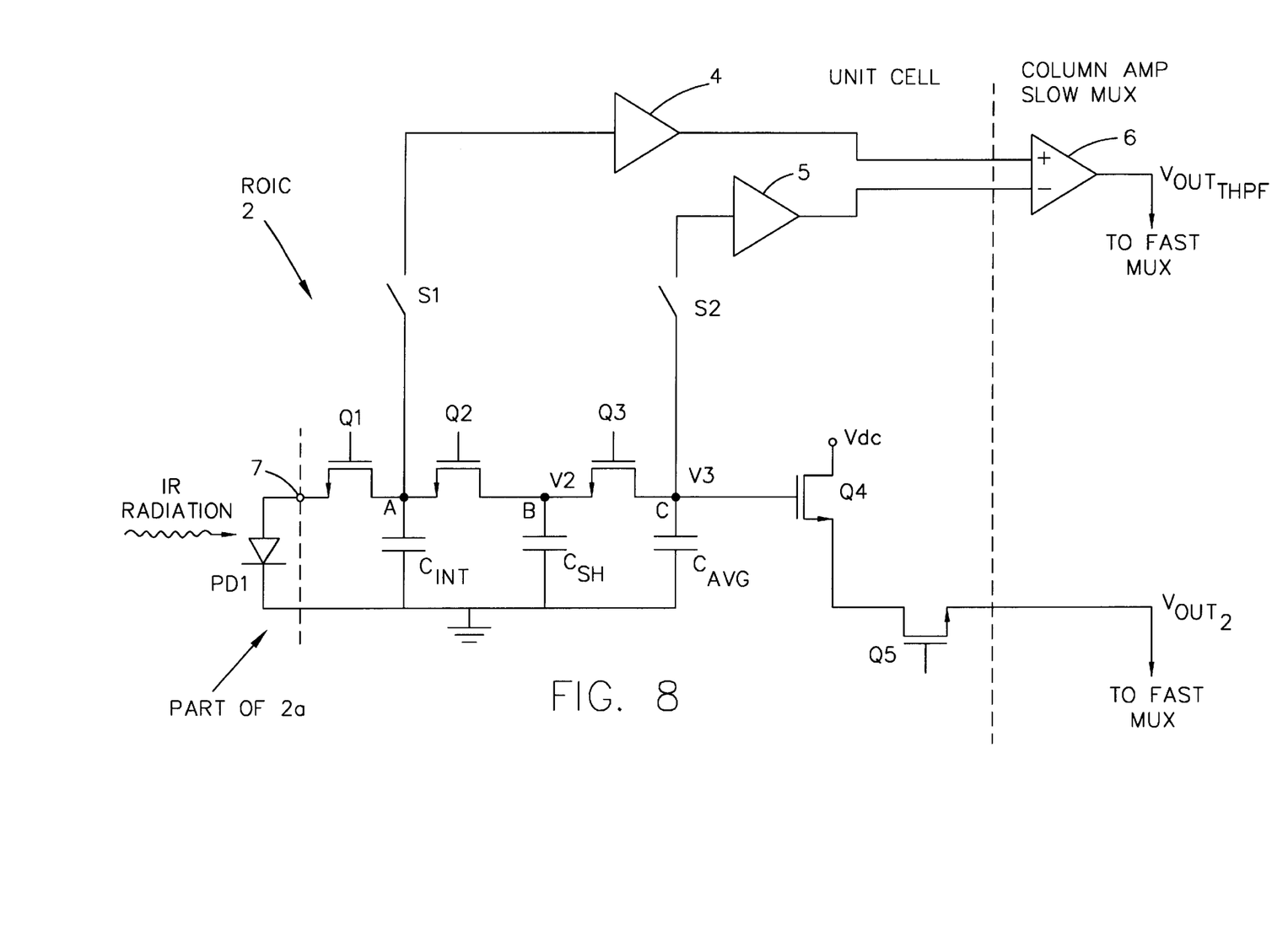
FIG. 8 is a schematic diagram of a multipurpose ROIC constructed in accordance with a second embodiment of the invention.

A second embodiment of a multipurpose ROIC 2 is shown in FIG. 8. The second embodiment is similar to the first embodiment except that the first input to the differencing operation amplifier 6, which produces the high pass filtered output $Vout_{THPF}$ in the first operating mode, is taken across node A. In the second embodiment, the voltage stored on the integration capacitor $C_{INT}$ has a lower switching noise as defined by the equation:

$$\text{switching noise} = \sqrt{\frac{kT}{C}}$$

where: k is Boltzmann's constant; T is temperature in Kelvin; and C is the capacitance across the integration capacitor $C_{INT}$.

It is appreciated that in the first and the second embodiments of the multipurpose ROIC 2 (as shown in FIGS. 2, 3, 5 and 8) the photodetector 2a is a photovoltaic device. However, it is within the scope of the present invention for other types of photoresponsive detectors to be used.

A multipurpose ROIC 2 constructed in accordance with the first and the second embodiments of the present invention provides superior performance in many infrared sensing applications. As discussed above, the high pass filtered output $Vout_{THPF}$ removes substantially all types of fixed pattern noise that plagues systems in a dynamic environment. Removing fixed pattern noise is particularly desirable in systems which require a shorter stare efficiency due to relative platform motion, for example, airborne applications. In such applications the presence of heat sources can cause a variable flux on the FPA which manifests itself as fixed pattern noise. Additionally, the multipurpose ROIC 2 constructed in accordance with the present invention corrects for high noise pixels and thus allows the use of detector arrays with lower than desired resistance-area products (RoAs).

Experimentation has determined that the subframe averaging circuit of the present invention provides enhanced sensitivity and stare efficiency. It has also been determined that the performance of the subframe averaging circuit is improved on platforms with slow platform motion due to the enhanced stare efficiency.

Typically, smearing may occur when conventional subframe averaging circuits are used on fast moving platforms. That is, the subframe averaging circuits can smear the image if the relative platform motion, i.e. A/C motion or target motion, is sufficient to move in angle more than a pixel during a frame period. The smearing effect is due to the fact that subframe averaging operates on several subframes within a frame period. In the present invention, however, some of the smearing effect inherent in subframe averaging circuits is reduced because the subframe averaging circuit of the present invention has a fading memory effect, i.e. because the charge averaging capacitor $C_{AVG}$ retains the more recent subframe. Also it has been found that, in a fast moving platform, it is desirable to have a minimum 15 integration time. The minimum integration time improves tracking by essentially capturing a "snapshot" of the input signal and thus prevents or reduces smearing.

For example, high pass filtered non-uniformity correction was employed on a video display image which had 3% gaussian noise. After the video display image was processed by the multipurpose ROIC 2 in accordance with the present invention, a significant improvement in image quality was achieved. In the example, a capacitance ratio of the IR-FPA 10 filtering the image was $C_{AVG}/C_{SH}=10$.

It can be appreciated that the present invention is not limited to the detection of IR radiation, nor is the invention limited to Group II–VI material for the detector array, nor limited to Group III–V detector material. For example, Silicon and Germanium based detector material could be used.

While the invention has been particularly shown and described with respect to preferred embodiments thereof, it will be understood by those skilled in the art that changes in form and details may be made therein without departing the scope and spirit of the invention.

What is claimed is:

1. A method for operating an array of radiation detectors, comprising the steps of:
   during a sampling period that defines a frame comprised of subframe periods, generating an electrical signal in individual ones of the radiation detectors, the electrical signals being generated in response to incident radiation;
   in a first operating mode, forming a high pass filtered output signal from electrical signals generated during at least one frame period;
   in a second operating mode, forming a subframe averaged output signal from electrical signals generated during a frame period; and
   reading out, in the first operating mode, the high pass filtered output signal or, in the second operating mode, the subframe averaged output signal.

2. A method as set forth in claim 1, wherein the array of radiation detectors is organized as a two dimensional array having rows and columns, and wherein the step of reading out one of the high pass filtered output signal or the subframe averaged output signal further comprises the step of reading out the output signal on a row-by-row basis.

3. A method as set forth in claim 1, wherein in the second operating mode, the method further comprises the steps of:
   in the frame period, integrating the generated electrical signal with a subframe averaging circuit during a plurality of subframe periods; and
   at the conclusion of the plurality of subframe periods, averaging the integrated electrical signal to form the subframe averaged output signal.

4. A method as set forth in claim 1, wherein the frame period is about 16.67 msec and there are up to about 64 subframe periods within each of the frame periods.

5. A method as set forth in claim 1, wherein in the first operating mode, the method further comprises the steps of:
   during the at least one frame period, integrating the generated electrical signal with an averaging circuit;
   during a predetermined frame period, averaging the integrated electrical signal to form an averaged charge signal; and
   subtracting the averaged charge signal from a currently generated electrical signal to form the high pass filtered output signal.

6. A method as set forth in claim 5, wherein the averaged charge signal is comprised of a low frequency charge pedestal.

7. A method as set forth in claim 5, wherein the predetermined frame period is comprised of a frame period which occurs once every m frame periods.

8. A method as set forth in claim 7, wherein the mth frame period is comprised of a frame period which occurs within a range of about 1–8 frame periods.

9. A method for operating an array of radiation detectors, comprising the steps of:
   during a frame period comprised of subframe periods, generating an electrical signal in individual ones of the radiation detectors, the electrical signals being generated in response to incident radiation;
   in a first operating mode, integrating the generated electrical signal with an averaging circuit during at least one frame period, and at a predetermined frame period, averaging and subtracting the integrated electrical signals from a currently generated electrical signal to form a high pass filtered output signal;
   in a second operating mode, integrating the generated electrical signal during the subframe periods, and at the conclusion of the subframe periods, averaging the integrated electrical signal to form a subframe averaged output signal; and
   reading out, in the first operating mode, the high pass filtered output signal or, in the second operating mode, the subframe averaged output signal.

10. A readout integrated circuit (ROIC) for coupling to a plurality of radiation detectors each of which outputs an electrical signal having a magnitude that is a function of an amount of radiation that is detected by said radiation detector, said ROIC comprising a plurality of readout circuit unit cells individual ones of which have an input that is switchably coupled to an associated one of said radiation detectors for receiving said electrical signals therefrom; wherein each of said readout circuit unit cells operates in one of a first mode to provide a corrected m frame averaged output signal and a second mode to provide a subframe averaged output signal.

11. A readout integrated circuit as set forth in claim 10, wherein each of said electrical signals is comprised of a desired signal component and a low frequency charge pedestal, and wherein a magnitude of said low frequency charge pedestal is approximately equal to a charge integrated and averaged within each of said readout circuits.

12. A readout integrated circuit as set forth in claim 10, wherein said plurality of readout circuit unit cells a reintegrated upon a common substrate with said plurality of radiation detectors.

13. A readout integrated circuit as set forth in claim 10, wherein said plurality of radiation detectors are formed upon a first substrate and said plurality of readout circuit unit cells are formed upon a second substrate, and wherein said first substrate is hybridized with said second substrate.

14. A readout integrated circuit as set forth in claim 10, wherein in said first operating mode each of said readout circuit unit cells further comprises:

an averaging circuit having an input switchably coupled to said associated radiation detector and providing an averaged charge signal; and a high pass filtering circuit having inputs switchably coupled to said averaging circuit and providing said corrected m frame averaged output signal;

wherein said high pass filtering circuit subtracts said averaged charge signal from said electrical signals to form said corrected m frame averaged output signal.

15. A readout integrated circuit as set forth in claim 14, wherein said averaging circuit further comprises:

an integration stage having at least one transistor electrically coupled to at least one integration capacitor;

a sample and hold stage having at least one transistor electrically coupled to at least one sample and hold capacitor, wherein said sample and hold stage is electrically coupled to said integration stage; and an averaging stage having at least one transistor electrically coupled to at least one charge averaging capacitor, wherein said averaging stage is electrically coupled to said sample and hold stage, and wherein said charge averaging capacitor holds said averaged charge signal.

16. A readout integrated circuit as set forth in claim 15, wherein charge of said averaged charge signal is averaged at a frequency set by a ratio of said sample and hold capacitor to said charge averaging capacitor, and said frequency at which said at least one transistor of said averaging stage is switched.

17. A readout integrated circuit as set forth in claim 14, wherein said high pass filtering circuit further comprises:

a first buffer amplifier having an input and an output, wherein said input is electrically coupled to a sample and hold stage;

a second buffer amplifier having an input and an output, wherein said input is electrically coupled to an averaging stage; and a differencing operational amplifier having two inputs and an output such that a first input is electrically coupled to said output of said first buffer amplifier and a second input is electrically coupled to said output of said second buffer amplifier, wherein said output of said differencing operational amplifier provides said corrected m frame averaged output signal.

18. A readout integrated circuit as set forth in claim 17, wherein said output of said differencing operational amplifier is provided by subtracting said averaged charge signal from said electrical signals in accordance with the following equation:

$$Vout_{THPF}[n] = V2[n] - \frac{C_{SH}V2[n-m] + C_{AVG}V3[n-m]}{C_{SH} + C_{AVG}}$$

where: V2 is a voltage measured at a node of said sample and hold stage; V3 is a voltage measured at a node of said averaging stage; $C_{SH}$ is a capacitance measured across at least one sample and hold capacitor of said sample and hold stage; $C_{AVG}$ is a capacitance measured across at least one charge averaging capacitor of said averaging stage; n is an index tracking a current sampled frame number; and m is a number of delay periods during which said capacitance measured across said sample and hold capacitor is sampled onto said charge averaging capacitor.

19. A readout integrated circuit as set forth in claim 14, wherein said high pass filtering circuit further comprises:

a first buffer amplifier having an input and an output, wherein said input is electrically coupled to an integration stage;

a second buffer amplifier having an input and an output, wherein said input is electrically coupled to an averaging stage; and a differencing operational amplifier having two inputs and an output such that a first input is electrically coupled to said output of said first buffer amplifier and a second input is electrically coupled to said output of said second buffer amplifier, wherein said output of said differencing operational amplifier provides said corrected m frame averaged output signal.

20. A readout integrated circuit as set forth in claim 19, wherein said output of said differencing operational amplifier is provided by subtracting of said averaged charge signal from said electrical signals in accordance with the following equation:

$$Vout_{THPF}[n] = V1[n] - \frac{C_{SH}V2[n-m] + C_{AVG}V3[n-m]}{C_{SH} + C_{AVG}}$$

where: V1 is a voltage measured at a node of said integration stage; V2 is a voltage measured at a node of a sample and hold stage; V3 is a voltage measured at a node of said averaging stage; $C_{SH}$ is a capacitance measured across at least one sample and hold capacitor of said sample and hold stage; $C_{AVG}$ is a capacitance measured across at least one charge averaging capacitor of said averaging stage; n is an index tracking a current sampled number; and m is a number of delay periods during which said capacitance measured across said at least one sample and hold capacitor is sampled onto said at least one charge averaging capacitor.

* * * * *